United States Patent [19]

Logan

[11] Patent Number: 4,686,463

[45] Date of Patent: Aug. 11, 1987

[54] MICROWAVE PROBE FIXTURE

[76] Inventor: John K. Logan, 26527 Silver Spur Rd., Rancho Palos Verdes, Calif. 90274

[21] Appl. No.: 685,410

[22] Filed: Dec. 24, 1984

[51] Int. Cl.$^4$ .................. G01R 1/06; G01R 31/02
[52] U.S. Cl. .................. 324/158 P; 324/72.5; 324/158 F
[58] Field of Search .......... 324/158 P, 158 F, 72.5, 324/73 PC; 333/33, 238

[56] References Cited

U.S. PATENT DOCUMENTS

| | | | |
|---|---|---|---|
| 3,560,907 | 2/1971 | Heller | 324/158 P |
| 3,775,644 | 11/1973 | Cotner et al. | 324/158 F |
| 3,867,698 | 2/1975 | Beltz et al. | 324/158 P |
| 4,045,737 | 8/1977 | Coberly | 324/158 P |
| 4,065,717 | 12/1977 | Kattner et al. | 324/158 P |
| 4,101,824 | 7/1978 | Breedlove et al. | 324/158 F |
| 4,195,259 | 3/1980 | Reid et al. | 324/158 P |
| 4,365,195 | 12/1982 | Stegens | 324/158 F |

OTHER PUBLICATIONS

"Introducing the World's First Microwave Wafer Probing Equipment"; Cascade Microwave, P.O. Box 2015, Beaverton, OR; 1983; 4 pages.
Bailey et al.; "A Neutron Hardness . . . "; IEEE Transactions on Nuclear Science; vol. NS-23; No. 6; Dec. 1976; pp. 2020-2023.
Van Tuyl et al.; A Manufacturing Process . . . "; IEEE Transactions on Microwave Theory and Techniques; vol. MTT-30; No. 7; Jul. 1982; pp. 935-941.

*Primary Examiner*—Ernest F. Karlsen
*Attorney, Agent, or Firm*—Gordon K. Anderson

[57] ABSTRACT

A fixture having a header plate (20) in rectangular shape with a notch (28) on each end and an aperture (22) in the middle defined as a through hole. A plurality of microwave connectors (30) are located on the top surface of the header plate (20) adjacent to the aperture and penetrate through the body with the connector extended contact planar with the bottom. A substrate (32) of dielectric material with a ground plane on one side and a plurality of striplines (34) on the other is attached into a recess peripherally positioned on the bottom side of the aperture (22). The striplines (34) are joined to the connectors (30) on one end and to individual probe needles (38) with angular tips on the other near the midmost point. A centrally located access opening (36) in the substrate (32) allows visual indication of the probe needles (38) for positioning upon node points and inspection points on a microwave semiconductor wafer under test. The device allows a flowpath for microwave signals from the needle tips through the striplines (34) to the connectors (30) for testing purposes.

13 Claims, 12 Drawing Figures

MICROWAVE PROBE FIXTURE

TECHNICAL FIELD

This invention relates to electrical measurement for testing using voltage probes with panel circuit arrangement having electrical connectors in general, more particularly to microwave semiconductor wafer or chip node point and inspection point continuity testing fixtures.

BACKGROUND ART

Previously, probe fixtures for testing semiconductor wafers have been limited to devices utilizing long unsupported needles on solid metallic contact probes that are operable up to frequencies of approx. 1.0 megahertz. An example of this prior art is found in U.S. Pat. No. 4,195,259 issued to Reid et al. In this disclosure an angled probe tip is connected to a support sleeve attached to an extended arm. The flowpath for the signal is directed through lead wires to the electronic amplifier, discriminator, buffer, etc. to an evaluated display.

Kattner et al in U.S. Pat. No. 4,065,717 teaches a plurality of leads on a backing plate that is transparent and resilient. The ends of the leads are provided with raised portions which establish the probes, preferably formed by conventional thin film or plating techniques. A vacuum is pulled on the chip under test firmly securing it in place while pressure is applied above the resilient backing plate causing deformation to occur, moving the probes into contact with the workpiece.

U.S. Pat. No. 3,867,698 issued to Beltz et al discloses a plurality of leads simultaneously bent into a truncated shape. The probe fingers are an extension of the lead, as above, but are formed at the same time with a conventional die set after the leads are secured in a plastic material. The fingers or probe tips are separated by severing with a sharp instrument. Further, the leads may be lapped to impart to them the desired degree of flatness and smoothness as to not damage the semiconductor beam leads on which they rest during probing.

P. V. N. Heller teaches in U.S. Pat. No. 3,560,907 an arrangement whereby a plurality of individual flexing arms are apportioned in a circular array. The flexing arms are spring loaded to provide resiliency with wire leads connected on the outside periphery of the enclosure to terminal posts for transmitting the electrical signal. The contact point that is contiguous with the workpiece is integrally formed with the connector contact which engages a prescribed point in the circuit, thereby permitting the conducting of measuring circuit response by external equipment.

Finally, U.S. Pat. No. 4,045,737 issued to Coberly discloses a similar arrangement where a plastic substrate is provided with a groove in which an electrically conductive contact or probe is positioned within a key portion. The probe contains a pair of cantilevers which bias against the edge of the substrate providing a planarity stop serving as vertical alignment. The bias produced by the cantilevers is overcome and a flat raises upwardly from the edge of the substrate as the point touches the chip. The electrical conductive flowpath is continued from the probe via a wire lead to a binding post and, hence, to collateral test apparatus.

While the prior art addresses the problem of compliance and provides an electrical flowpath for frequencies up to 1.0 megahertz using conventional wires and conductive structure, it is still lacking in structure that is capable of conveying signals of higher frequency. As different means to conduct microwave signals are required, such as coaxial cables and isolated flowpaths, prior art has apparently not as yet delved into the discipline dealing with frequencies of over 500 megahertz.

For background purposes and as indicative of the art to which the invention relates, further reference may be made to the following U.S. patents.

| No. 4,365,195 | Stegens | December 21, 1982 |
| No. 4,101,824 | Breedlove et al | July 18, 1978 |
| No. 3,775,644 | Cotner et al | November 27, 1973 |

DISCLOSURE OF THE INVENTION

The conventional step in semiconductor wafer manufacture is the probing of the patterns on the wafer to test for circuitry in the chip. Fixed point probe cards are normally used for probing of wafers up to one megahertz. However, at higher frequencies commercial probe cards have excessive cross-talk and radiation due to the long unshielded leads.

Prior art has utilized a ground plane stripline microstrip and coplanar wave guide structures to conduct signals on the probe card, however, it is necessary that unshielded probe needles project from the card in order to contact the input or output pads of the chips on the wafer. These unshielded probe needles have the electrical properties of inductance. At frequencies over approximately one gigahertz, this inductance results in an impedance that becomes so great that it completely blocks the signals from the chip under test. It is, however, necessary that needles of some length project beyond the probe test fixture. This is requisite to provide the operator with visibility of the needle tips in contact with the pads on the chip. Typically, the pads are only 0.002 inches × 0.002 inches ( 0.005 × 0.005 centimeters) in size or could be up to double that magnitude. The proper alignment of the probe needles on the chip pads is, therefore, essential if valid test results are to be obtained. Further, the projecting needles provide compliance as there is always some degree of out of plane condition existing between the probe fixture and the wafer under test. Additionally, needles on the probe fixture may not necessarily be coplanar, therefore, in order to avoid abuse by gouging or piercing the device pads, the needles must have some resiliency to prevent this damage.

At frequencies above 500 megahertz the interface connection to the probe card or probe fixture becomes critical. Standing waves and reflections may be generated by improper connection of the probe and could destroy the test signal completely. At high frequencies subminiature, or microminiature, coaxial connectors may be used to interconnect the probe fixture to coaxial cables that carry the test signals to the test equipment.

Inasmuch as needles are an optimum expedient to accomplish this probe procedure, it is a primary object of the invention to obtain the shortest probe needles possible. This is accomplished by mounting the needles on the bottom side of the substrate. These needles can be as short as 0.010 to 0.050 inches (0.0254 to 0.127 centimeters). This permits testing at frequencies up to 25 gigahertz before the inductance of the probe needle causes an excessively high impedance to the electronic signals. Compliance is still provided, even with the very short probe needles. This allows the bending of the needles to occur to compensate for the difference of out of plane conditions that occur on the pads of the semiconductor device. These pads are very delicate and may be as thin as 500 angstroms and are subject to punch through. The instant invention with these needles overcomes this problem allowing compliance on all the pads without any detrimental effect.

An important object of the invention allows the individual probe needles to be soldered directly to the thin metal striplines on the substrate. This provides a strong mechanical bond as well as giving a low resistance electrical joint. By mounting these needles on the bottom of the substrate, approximately 0.010 inch(0.254 M.M.) or greater may be saved, as this is the customary thickness of substrates utilized in microwave frequencies. A special soldering fixture is used to give accurate control of the solder flow and prevent solder from bridging to adjacent striplines.

Another object of the invention allows the use of commercially available high frequency connectors that are attached to the edges of the substrate by the use of thin metal ribbon. This unique positioning of the connectors next to edges of the substrate drastically reduces standing waves and reflections and permits testing at the required higher frequencies. The preferred embodiment installs the connectors at 90 degrees to the plane of the substrate, however, in another embodiment the connectors are placed angularly from 90 degrees to coplanar in order to provide a still lower impedance path from the connector to the stripline on the substrate.

Still another object of the invention is directed to physical size allowing it to be accommodated in a standard commercial probe fixture. Ordinarily, high frequency probe fixtures require a special probe station to hold them. This object is especially important in high volume wafer probing since commercial automatic or manual probe stations, such as used by Pacific Western, Electroglas, and TAC are normally used for wafer probing. Further, the hole in the center of the substrate is cut to fit the contour of the semiconductor chip under test. This permits the above mentioned shorter needles and less cantilever of the needles, reducing the impedance in the overall system.

Yet another object of the invention provides an alternate substrate design having an insert in the center of the substrate. This insert is smaller and can easily be removed, providing convenient replacement of any broken or defective needles. The insert is electrically connected to larger substrate by ribbon bonding between the two with the mother substrate permanently attached to the header plate.

A final object of the invention is the ability to locate the probe tips within plus or minus 0.001 inch (0.0025 CM) or closer onto the device pads which in some instances may be as small as 0.001 inch (0.0025 CM) square.

BEST MODE FOR CARRYING OUT THE INVENTION

Figure 1:
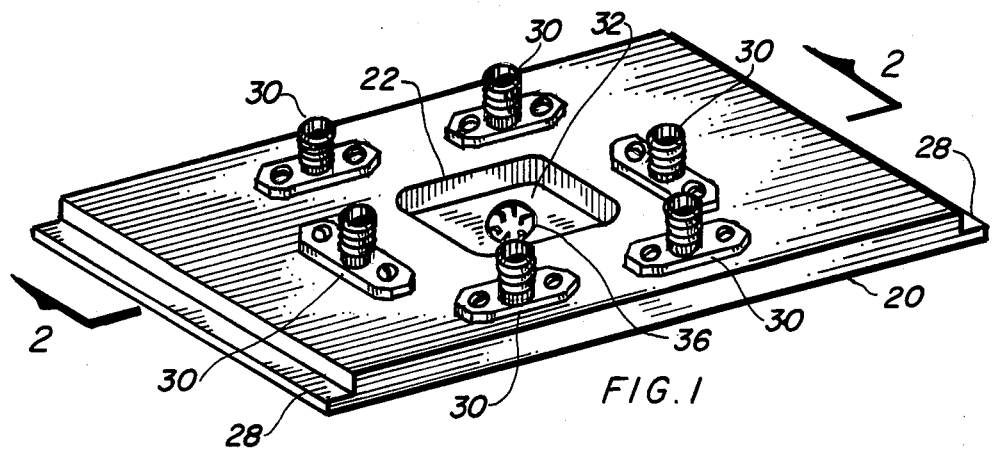
FIG. 1 is a partial isometric view of the preferred embodiment viewed from the top.
Figure 2:
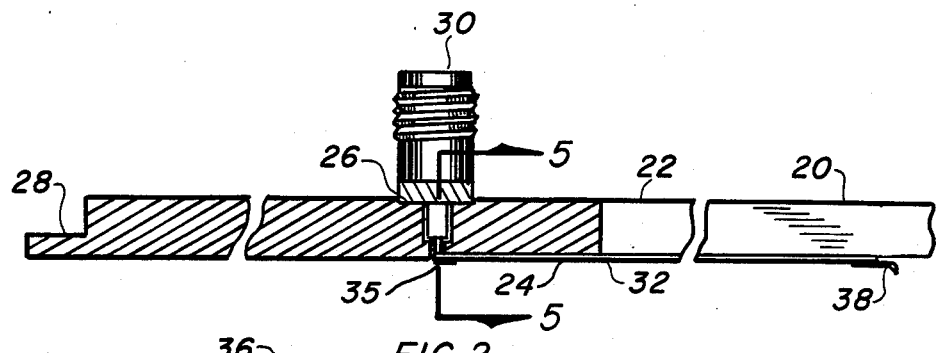
FIG. 2 a partial cross-sectional view taken along lines 2—2 of FIG. 1, with the connector shown partially cut-away for clarity.
Figure 3:
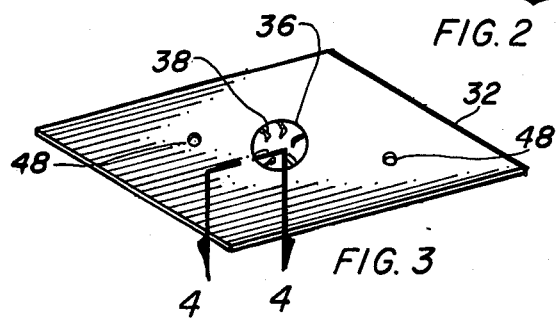
FIG. 3 is a partial isometric view of the substrate removed from the invention as viewed from the top.
Figure 4:
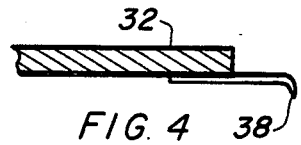
FIG. 4 is a cross-sectional view of the substrate illustrating one of the needles taken along lines 4—4 of FIG. 3.
Figure 5:
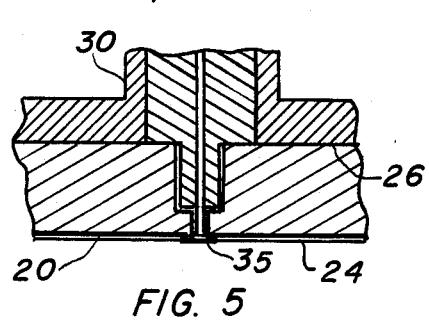
FIG. 5 is a partial cross-sectional view of the connector in the header plate taken along lines 5—5 of FIG. 2.

Referring now in detail to the drawings and describing the preferred embodiment, the invention consists of a header plate 20 in rectangular shape having a top and a bottom. This plate 20 further contains an aperture 22 located in the center forming a cut-out void through the entire plate 20. The bottom side of the header plate 20 contains a recess 24 around the aperture 22, preferably an equal distance from the internal edge. This recess 24 is in the shape of an inverted shelf and is wide enough to receive an element, such as a substrate when rested thereupon.

In close proximity to both the aperture 22 and the recess 24, is a plurality of cavities 26 that are located through the plate 20 and are the same shape as a microwave connector, except slightly larger. These cavities 26 consist of a hollow to receive the flange of the connector with necessary tapped holes at the appropriate interface positions. Further, a round chamber is located directly beneath the hollow for the connector dielectric portion and a round bore penetrates completely through for clearance of the connector extended contact. The physical location of this cavity 26 is important in that the bore is preferably 0.010 inches (0.254 millimeters) from the recess 24 with its purpose explained hereafter. The number of cavities 26 may vary, as to coincide with the particular wafer configuration in relation to the number of node points or inspection points under test.

The opposed ends of the header plate 20 contain a notch 28 for containment by the testing apparatus. This notch extends across the entire end and is the thickness of standard commercially available probe fixtures well known in the art. The width of the apparatus is also compatible with that of prior art allowing existing probe stations to use the device without modification or alteration.

The header plate 20 is fabricated of brass, aluminum, or other similar metal having structural strength and dimensional stability. The finish is preferably plating with another metal, such as gold, electrodeposited on the external surface. Other shapes and forms may be incorporated into the fixture without departing from the basic function and utility of the apparatus.

A threaded microwave connector 30 is attached into each of the cavities 26 with fasteners through a mounting flange. This connector 30 may be any miniature or microminiature style, preferably the subminiature coaxial industry standard type SMA, having a stainless steel passivated body, 2 hole flange, and a beryllium copper extended contact and thermoplastic insulator. This style is commonly used in the art with elevated frequencies, such as up to 500 megahertz and higher, commonly used for connecting coaxial cables to testing apparatus. Other styles and types of connectors may also be utilized in the invention provided they have an extended contact, such as the 4 hole flange, threaded body, or the end launch style. The method of attaching this microwave connector is preferably by the use of at least 2 threaded fasteners each into a tapped hole in the hollow of the header plate 20. If a 4 hole flange is utilized, the same method is practiced. The flange mounted panel receptacle is selected due to its ease of location and its permanent dimensional integrity when installed.

A substrate 32 is disposed beneath the previously described aperture 22 and nested into the recess in the header plate 20 becoming flush with the bottom surface. The substrate 32 is made of a dielectric material having nonconductive properties when subjected to electrical energy, such as sapphire, ceramic, or other suitable composition. Typically, but not necessarily, the substrate 32 is 0.010 inches (0.254 millimeters) thick. This thickness allows sufficient rigidity and structural strength for handling while providing ample electrical isolation from the metallic header plate 20.

The top side of the substrate 32 that is in contact with the plate 20 contains a ground plane layer of metal, such as titanium, tungsten, and gold. This metalizing is accomplished by sputtering or evaporating the metal onto the surface. This procedure is well known in the art and provides a surface wherein the substrate 32 may be permanently attached to the header plate 20. The attachment is accomplished by soldering or alternatively by the use of a conductive epoxy adhesive. An intimate contact is necessary in order to provide a low impedance ground connection to the header plate.

An access opening 36 is located in the approximate center of the substrate 32 and is shaped to fit the basic outline of the semiconductor wafer under test. The size and shape of this opening 36 may, therefore, vary with each fixture in conjunction with the individual workpiece.

A plurality of conductive striplines 34 are fixed to the underside of the substrate 32 and extend from just beyond the outside peripheral edge to the exact boundary of the opening 36. These striplines 34 are attached to the extended contact of the connector 30 on the outside end. As the connector 30 is positioned within the aforementioned cavities 26 and the bore is located in the center as close as possible, at least within 0.010 inches (0.254 MM) from the recess 24, this proximity affords minimum spacing before permanent attachment to the connector 30. The bonding of the two elements is by known methods, such as soldering, ultrasonic bonding, thermocompression welding, or gap welding. The striplines 34 are of electrically conductive metal. In practice, the stripline has been successfully sized at 0.001 to 0.003 inches (0.025 to 0.076 MM) thick x 0.010 (0. 254 MM) wide, however, this may vary with the thickness of the substrate. The width of the striplines must be carefully controlled, as the width determines the electrical impedance of the substrate. It will be noted that the optimum condition embodies the stripline width equal to the thickness of the substrate.

The stripline 34 may either be deposited upon the bottom surface of the substrate 32 by sputtering and etching or evaporating the metal. The striplines 34 are fanned out to the maximum extent to keeping the traces separated. The converging approach of the stripline 34 to the access opening 36 is made in such a manner as to be straight and inline with the workpiece.

A plurality of angular probe needles 38 are fixed to the conductive striplines in the proximity of the aperture 22. The location of these needles 38 is to be in such a position as to align with the node points and test points of the semiconductor wafer under test. The needles 38 then become the interface between the workpiece and the fixture extending the electrical conductivity flowpath from the needle 38 through the stripline 34 to the microwave connector 30. The needles 38 preferably have a round shank with one end sharp and the other blunt. The sharp end is bent at an approximate right angle near the tip. The needles 38 are attached to the stripline 34 at the access opening 36 terminating end allowing sufficient shank to be juxtapositioned upon the stripline 34. The ground probe needles 38 are similarly constructed, except they are longer and are attached all the way through to the ground plane on the top surface 32. This attachment is made preferably by soldering, allowing the balance of the shank and sharp end to cantilever from the stripline 34 on the substrate 32. This attachment location not only places the sharp tip of the needle 38 directly over the workpiece, but allows spring movement when all needles 38 contact their respective wafer node and inspection points. This arrangement provides compliance with all points simultaneously. It will be noted that the access opening 36 provides visual indication of the workpiece, so as to align all of the needles 38 by precise physical movement of the fixture. All of the needles 38 have an angular bend disposed at the appropriate orientation making the projection from the underside of the substrate 32 to the workpiece almost identical with any minor variation taken up by the resiliency of the needle shank.

Figure 6:
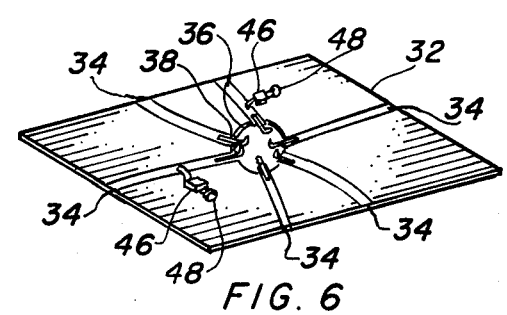
FIG. 6 is a partial isometric view of the bottom side of the substrate completely removed from the invention for clarity.

FIG. 6 illustrates a number of tuning elements 46 in the form of capacitors and the like that are attached to the underside of the substrate 32. These elements 46 are used in association with the external testing apparatus in tuning the signal to and from the semiconductor under test. They are bonded with adhesive to the substrate 32 and a hole 48 is located adjacently. A ribbon conductor 35 is positioned through the hole and affixed to the ground plane on the top side of the substrate on the end and to the tuning element 46 on the other. Another rubbon 35 is attached on the junction side of the element to the associated stripline 34. This ancillary device is optionally installed to the circuitry of the invention.

Figure 9:
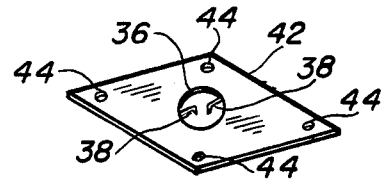
FIG. 9 is a partial isometric view of the insert substrate viewed from the top.
Figure 10:
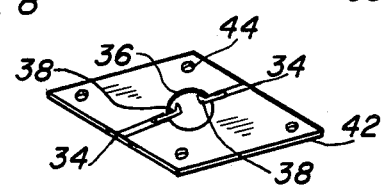
FIG. 10 is a partial isometric view of the insert substrate viewed from the bottom.
Figure 11:
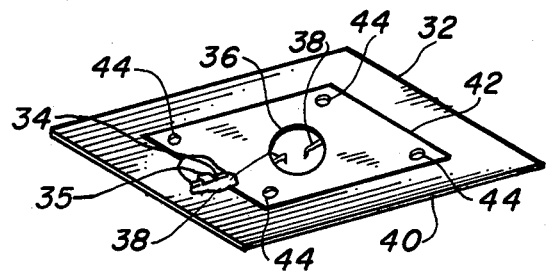
FIG. 11 is a partial isometric of the mother substrate containing the insert substrate viewed from the top.
Figure 12:
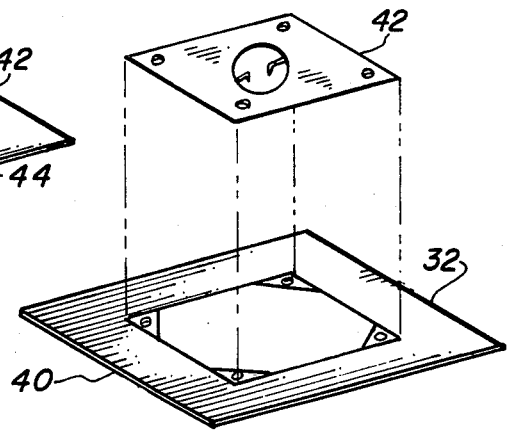
FIG. 12 is a partial isometric view of the mother substrate on the bottom and the insert removed and shown above illustrating the relationship of the two substrates.

Another embodiment of the substrate 32 is depicted in FIGS. 9-12, wherein the body is in two separate pieces. The mother body 40 is the same configuration and material as previously described, except a large window is cut-out in the center with the corners boxed. The striplines 34 terminate at the edge of the window on one end and, as before, on the external periphery. FIG. 12 illustrates the mother body 40 taken singly with the insert substrate 42 directly above. This insert 42 is again a duplicate of the preferred embodiment, except smaller and attaching holes 44 for threaded fasteners are located near each corner. The insert 42 and mother body 40 are connected together at the corners with fastening means well known in the art, and the junction between the striplines 34 is made by bonding a ribbon 35 between the two contact surfaces. A ribbon 35 of the same width and preferably 0.001 inches (0.025 millimeters) thick of the same thickness of the stripline is utilized for the joint. This arrangement allows easy replacement of any broken or defective probe needles 38 as the mother substrate 40 is permanently attached to the header plate 20 with conductive epoxy or solder. FIG. 9 illustrates the insert 42 from the top while FIG. 10 depicts the bottom with the needles 38 exposed.

Figure 7:
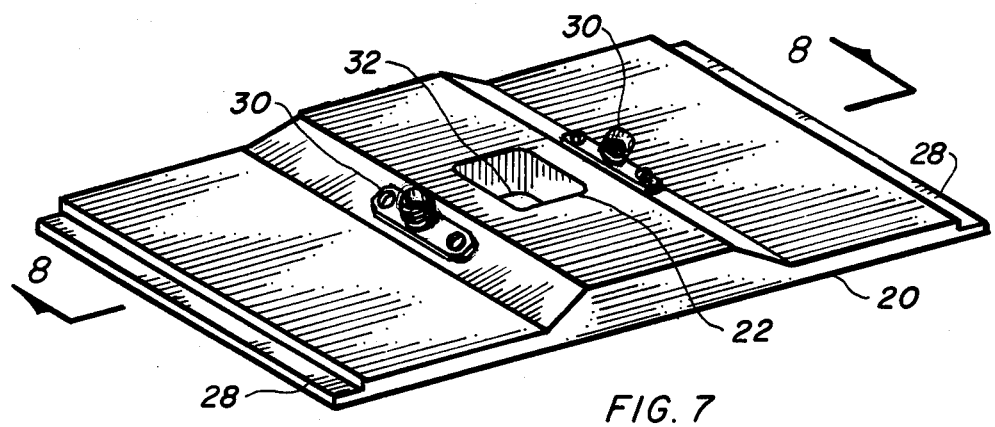
FIG. 7 is a partial isometric view of another embodiment with the connectors located angularly on the header plate, as viewed from the top side.
Figure 8:
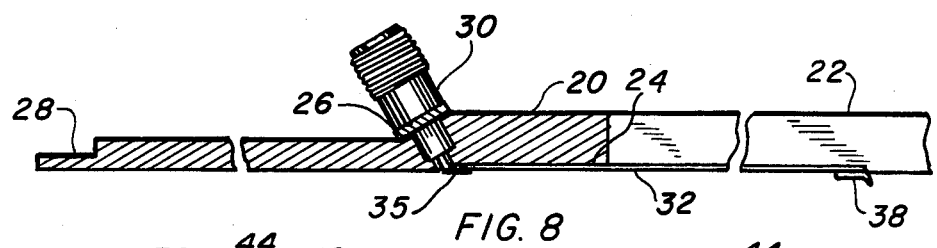
FIG. 8 is a partial cross-sectional view taken along lines 8—8 of FIG. 7 showing the connector partially cut-away.

In yet another embodiment, shown in FIGS. 7 and 8, the microwave connectors 30 are attached angularly to the header plate 20 within the cavities 26. The angle may be from 90 degrees to planar to the top surface of the plate 20. This angular disposition allows the extended contact of the microwave connector 30 to be closer to the substrate 32 providing a still lower impedance path in the junction. While the header plate is shown in FIGS. 7 and 8 with only a single connector 30 if multiples are used on all four sides, the configuration of the plate will coincide having an angular surface as required. It will be noted that the thickness of the header plate 20 is now on two planes with the angular surface therebetween. The function and interface with the test equipment remains the same and only the tip of the connector 30 extended contact is modified by creating an angle for attachment to the striplines 34.

The embodiments illustrated in the accompanying drawings depict only a representative number of connectors 30 and probe needles 38, as the actual quantity is governed by the configuration of the workpiece and will vary as required. Also, any combination of connectors from straight vertical 90 degree angles to planar may be used dependent upon the desired impedance limitation of the circuit. It is known that the flatter the flowpath in this junction, the less difficulty with standing waves occur.

While the invention has been described in complete detail and pictorially shown in the accompanying drawings, it is not to be limited to such details, since many changes and modifications may be in the invention without departing from the spirit and the scope thereof. Hence, it is described to cover any and all modifications and forms which may come within the language and scope of the appended claims.

I claim:

1. A multiport microwave semiconductor wafer node point and inspection point probe fixture comprising:
    (a) a header plate having a top, bottom, and an aperture centrally located therethrough:
    (b) a plurality of threaded microwave connectors attached at right angles to said header plate in spaced relationship with said aperture having the connector contact penetrating through said header plate for external attachment;
    (c) a substrate disposed beneath said header plate aperture having an access opening centrally located therein;
    (d) a plurality of conductive striplines fixed to the underside of said substrate extending from said access opening to the outside edge in alignment and contiguous with said microwave connector contacts and,
    (e) a plurality of angular probe needles fixed to said conductive striplines in proximity of substrate aperture in such a position as to align with node points and test points on said semiconductor wafer extending the electrical conductivity flowpath from said needle through the stripline to said microwave connector providing means to test the wafer circuits.

2. The invention as recited in claim 1 further comprising:
    (a) said header plate being rectangular in shape:
    (b) said header plate top having a plurality of cavities therein to receive said microwave connectors for positive positioning thereof,
    (c) said header plate bottom having a recess around said aperture for receiving said substrate in a flush manner when nested thereunto; and,
    (d) opposed ends of said header plate having notches for containment thereof by testing apparatus.

3. The invention as recited in claim 1 wherein said plurality of cavities further comprise:
    (a) said cavities having a hollow extending downward from said top, larger in size than said microwave connector to receive the connector flange for physical attachment and positive alignment;
    (b) said cavities having a round chamber beneath said hollow, larger in size than the insulated portion of said microwave connector for clearance; and,
    (c) said cavities having a round bore beneath said chamber, larger in size than the extended contact portion of said microwave connector allowing connection to said conductive striplines.

4. The invention as recited in claim 1 wherein said microwave connectors further comprise:
    a subminiature microwave frequency panel receptacle with a mounting flange having an extended contact and insulator.

5. The invention as recited in claim 1 wherein said substrate further comprises:
    (a) a body of dielectric material having nonconductive properties when subjected to electrical energy; and,
    (b) a ground plane layer of metal on the top side of said body providing a low impedance ground connecting surface for attachment to said header plate.

6. The invention as recited in claim 1 further comprising:
    said striplines are metallic formed by sputtering the metal on the surface and etching the surplus away.

7. The invention as recited in claim 1 further comprising:
    said probe needles having a round shank with a first and second end, said first end being sharp and angularly bent, and the second end blunt and straight forming a resilient member when fixed to said striplines on the second end allowing spring movement of said needle when contacting said wafer node point and inspection points when urged thereupon defining simultaneous compliance of all needles.

8. The invention as recited in claim 1 further comprising:
    said probe needles fixed to said conductive striplines by bonding.

9. The invention as recited in claim 1 wherein said substrate further comprises:
    (a) a body of dielectric material having nonconductive properties when subjected to electrical energy;
    (b) a ground plane layer of metal on the top side of said body providing a low impedance ground connecting surface for attachment to said header plate;

(c) said body having a centrally located insert opening therein; and, (d) an insert substrate smaller in peripheral dimension than said insert opening allowing insertion into said substrate body creating a unitary member with capabilities of replacement.

10. The invention as recited in claim 1 further comprising:

a plurality of tuning elements attached to said substrate with leads connected to said header plate for grounding and leads to attach to said conductive striplines for tuning the signal associated with external testing apparatus.

11. A multiport microwave semiconductor wafer node point and inspection point probe fixture comprising:

(a) a header plate having a top, bottom, with an aperture centrally located therethrough;

(b) a plurality of threaded microwave connectors attached angularly to said header plate in spaced relationship with said aperture having the connector contact angularly penetrating through said header plate for external attachment;

(c) a substrate disposed beneath said header plate aperture having an access opening centrally located therein;

(d) a plurality of conductive striplines fixed to the underside of said substrate, extending from said access opening to the outside edge in alignment and contiguous with said microwave connector contact; and, (e) a plurality of angular probe needles fixed to said conductive striplines in proximity of said substrate aperture in such a position as to align with node points and test points on said semiconductor wafer extending the electrical conductivity flowpath from said needle through the stripline to said microwave connector providing means to test the wafer circuits.

12. The invention as recited in claim 11 further comprising:

(a) said header plate being rectangular in shape;

(b) said header plate top having a plurality of cavities angularly disposed from 90 degrees to planar from said top located to receive said microwave connectors for positive positioning thereof.

(c) said header plate bottom having a recess around said aperture for receiving said substrate in a flush manner when nested thereunto: and, (d) opposed ends of said header plate having notches for containment thereof by testing apparatus.

13. The invention as recited in claim 11 wherein said microwave connectors further comprise:

a subminiature microwave frequency panel receptacle with a mounting flange having an extended contact with an angular tip surrounded by a cylindrical insulator.

* * * * *